(12) United States Patent
Hasnain et al.

(10) Patent No.: US 8,084,775 B2
(45) Date of Patent: Dec. 27, 2011

(54) LIGHT SOURCES WITH SERIALLY CONNECTED LED SEGMENTS INCLUDING CURRENT BLOCKING DIODES

(75) Inventors: Ghulam Hasnain, Livermore, CA (US); Steven D. Lester, Livermore, CA (US); Syn-Yem Hu, Livermore, CA (US); Jeff Ramer, Livermore, CA (US)

(73) Assignee: Bridgelux, Inc., Livermore, CA (US)

( * ) Notice: Subject to any disclaimer, the term of this patent is extended or adjusted under 35 U.S.C. 154(b) by 47 days.

(21) Appl. No.: 12/725,424

(22) Filed: Mar. 16, 2010

(65) Prior Publication Data

US 2010/0219431 A1   Sep. 2, 2010

(51) Int. Cl.
*H01L 33/00* (2010.01)

(52) U.S. Cl. ........ 257/93; 257/79; 257/88; 257/13; 257/99; 257/E33.062; 257/E33.064; 257/E33.066; 438/28; 438/34

(58) Field of Classification Search ............. 257/79, 257/88, 93, 94, 13, 99, E33.062, E33.064, 257/E33.066; 438/28, 34
See application file for complete search history.

(56) References Cited

U.S. PATENT DOCUMENTS

| 6,339,233 | B1 * | 1/2002 | Lell ............... 257/195 |
| 7,213,942 | B2 * | 5/2007 | Jiang et al. ........ 362/231 |
| 2007/0102693 | A1 * | 5/2007 | Nagai ............... 257/13 |
| 2007/0284598 | A1 * | 12/2007 | Shakuda et al. ...... 257/93 |

* cited by examiner

*Primary Examiner* — A. Sefer
*Assistant Examiner* — Ermias Woldegeorgis
(74) *Attorney, Agent, or Firm* — Calvin B. Ward

(57) ABSTRACT

A light source and method for making the same are disclosed. The light source includes a substrate and a light emitting structure that is deposited on the substrate. A barrier divides the light emitting structure into first and second segments that are electrically isolated from one another. A serial connection electrode connects the first segment in series with the second segment. A first blocking diode between the light emitting structure and the substrate prevents current from flowing between the light emitting structure and the substrate when the light emitting structure is emitting light. The barrier extends through the light emitting structure into the first blocking diode.

8 Claims, 6 Drawing Sheets

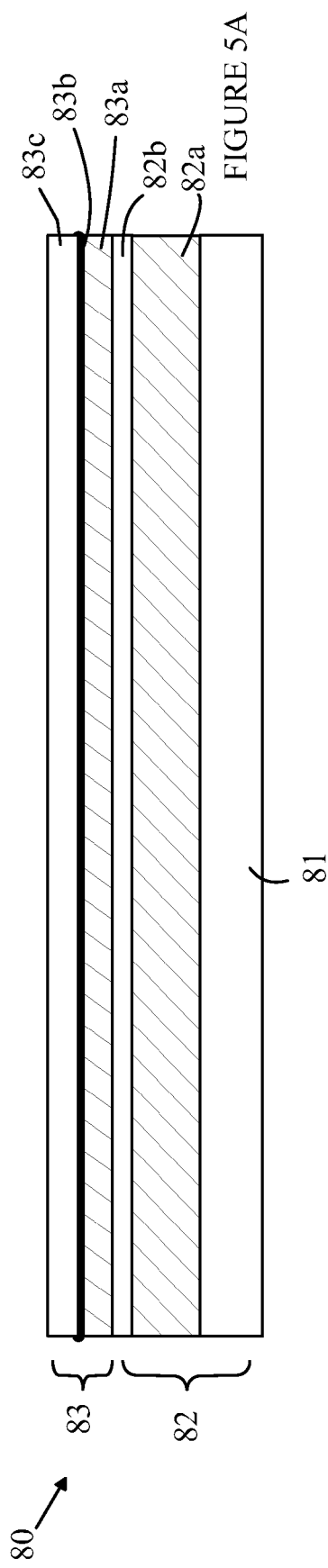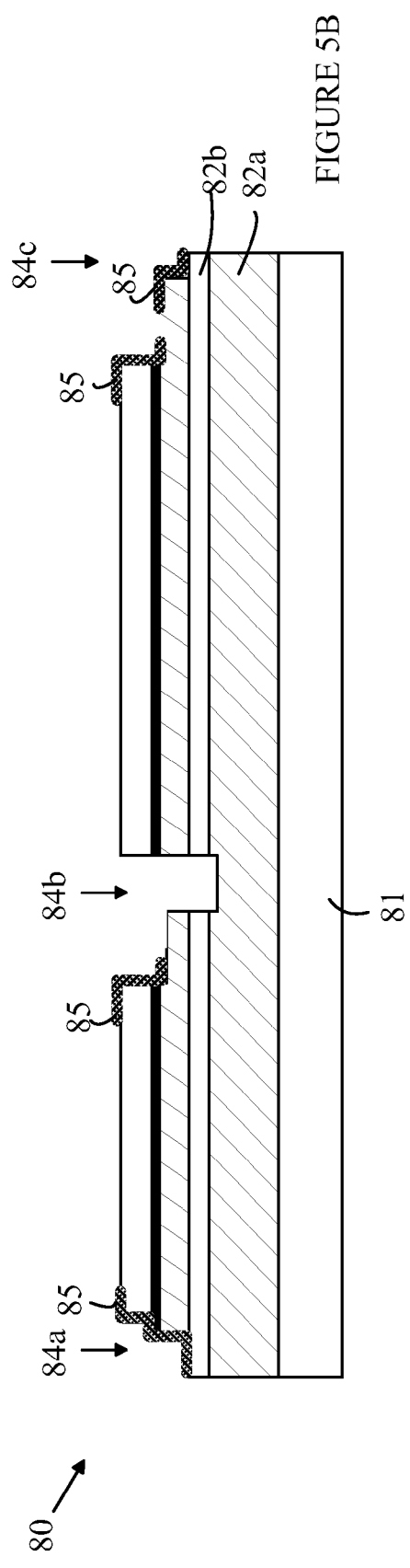

LIGHT SOURCES WITH SERIALLY CONNECTED LED SEGMENTS INCLUDING CURRENT BLOCKING DIODES

BACKGROUND OF THE INVENTION

Light emitting diodes (LEDs) are an important class of solid-state devices that convert electric energy to light. Improvements in these devices have resulted in their use in light fixtures designed to replace conventional incandescent and fluorescent light sources. The LEDs have significantly longer lifetimes and, in some cases, significantly higher efficiency for converting electric energy to light. LED-based white light sources are typically made by packaging one or more blue LED chips with suitable yellow and red phosphors.

For the purposes of this discussion, an LED chip can be viewed as a semiconductor having three layers, the active layer sandwiched between two other layers. The active layer emits light when holes and electrons from the outer layers combine in the active layer. The holes and electrons are generated by passing a current through the LED chip. The LED chip is powered through an electrode that overlies the top layer and a contact that provides an electrical connection to the bottom layer.

The cost of LED chips and their power conversion efficiency are important factors in determining the rate at which this new technology will replace conventional light sources and be utilized in high power applications. The power conversion efficiency of an LED chip is defined to be the ratio of optical power emitted by the LED chip in the desired region of the optical spectrum to the electrical power dissipated by the light source. Electrical power that is not converted to light that leaves the LED is converted to heat that raises the temperature of the LED. Rise in the chip temperature places a limit on the power level at which an LED operates. In addition, the conversion efficiency of the LED generally decreases with increasing current especially at the higher current densities that enable lowering the cost of light; hence, while increasing the light output of an LED by increasing the current increases the total light output, the electrical conversion efficiency is decreased by this strategy. In addition, the lifetime of the LED is also decreased by operation at high currents.

LED light sources made from a single LED chip even as large as a square millimeter in size, are not yet capable of generating sufficient light to replace conventional light sources for many applications. In general, there is a limit to the light per unit area of LED that can be practically generated at an acceptable power conversion efficiency. This limit is imposed by the power dissipation and the electrical conversion efficiency of the LED material system. Hence, to provide a higher intensity single LED source, larger area chips must be utilized; however, the light extraction efficiency reduces as chip size gets bigger for most types of LED chips and also there is a limit to the size of a single LED chip that is imposed by the fabrication process used to make the LED chips. As the chip size increases, the yield of chips due to random defects decreases, and hence, the cost per LED chip increases faster than the increase in light output once the chip size increases beyond a predetermined size.

Hence, for many applications, an LED-based light source must utilize multiple LEDs to provide the desired light output. For example, to replace a 100-watt incandescent bulb for use in conventional lighting applications, approximately 25 LED chips of the order of 1 mm$^2$ size are required. This number can vary depending on the color temperature desired and the exact size of the chips. The drive voltage for a typical GaN LED chip is typically about 3.2-3.6V. If all of the LED chips are connected in parallel, the DC power supply must deliver a large current at a low voltage, which presents challenges in terms of AC to DC power conversion efficiency and the size of the conductors that must be used to deliver the high currents without dissipating a significant fraction of the power in resistive losses.

One method for reducing these problems involves dividing a die of more or less optimum size into a plurality of series connected LED segments. Such a structure is shown in co-pending application Ser. No. 12/208,502, filed on Sep. 11, 2008, which is hereby incorporated by reference. The optimum size of a die depends on the details of the chip design and on the yield of the semiconductor process used to fabricate the dies. For any given process there is an optimum size from a cost point of view. If the die is used as a single LED with a drive voltage of the order of 3 volts, a large current must be provided at the die to maximize the light output. If the die is divided into N smaller LED segments that are connected in series, the drive voltage is increased by a factor of N, and the drive current is decreased by a factor of N, which provides improvements both in the efficiency of the power supply that provides the drive current and a reduction in the resistive losses within the die.

One prior art method for dividing the die into the component LED segments involves cutting isolation trenches that extend from the surface of the die to the underlying resistive substrate to isolate the individual component LEDs from one another. The individual component LEDs are then connected in series by providing a conductor that connects the n-layer of each component LED to the p-layer of an adjacent component LED. These deep trenches increase the cost of production of the dies and interfere with the extraction of light from the sides of the die.

SUMMARY OF THE INVENTION

The present invention includes a light source and method for fabricating the same. The light source includes a substrate and a light emitting structure that is deposited on the substrate. A barrier divides the light emitting structure into first and second segments that are electrically isolated from one another. A serial connection electrode connects the first segment in series with the second segment. A first blocking diode between the light emitting structure and the substrate prevents current from flowing between the light emitting structure and the substrate when the light emitting structure is emitting light. The barrier extends through the light emitting structure into the first blocking diode.

In one aspect of the invention, the substrate includes a transition layer of semiconductor material that is transparent to light generated by the light emitting structure. The barrier includes a trench extending through the light emitting structure and terminating in the transition layer. Light from the first segment can travel through the transition layer between the segments.

BRIEF DESCRIPTION OF THE DRAWINGS

FIGS. 5A-5C are cross-sectional views of a light source 80 at various stages in the fabrication process.

DETAILED DESCRIPTION OF THE PREFERRED EMBODIMENTS OF THE INVENTION

Figure 2:
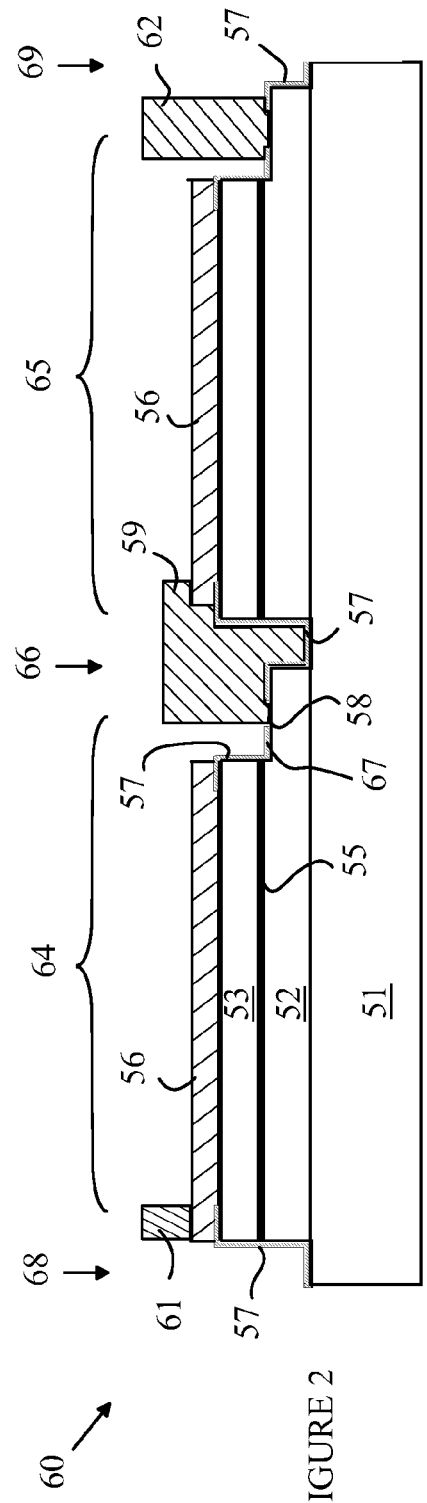
FIG. 2 is a cross-sectional view of segmented LED 60 through line 2-2 shown in FIG. 1.
Figure 1:
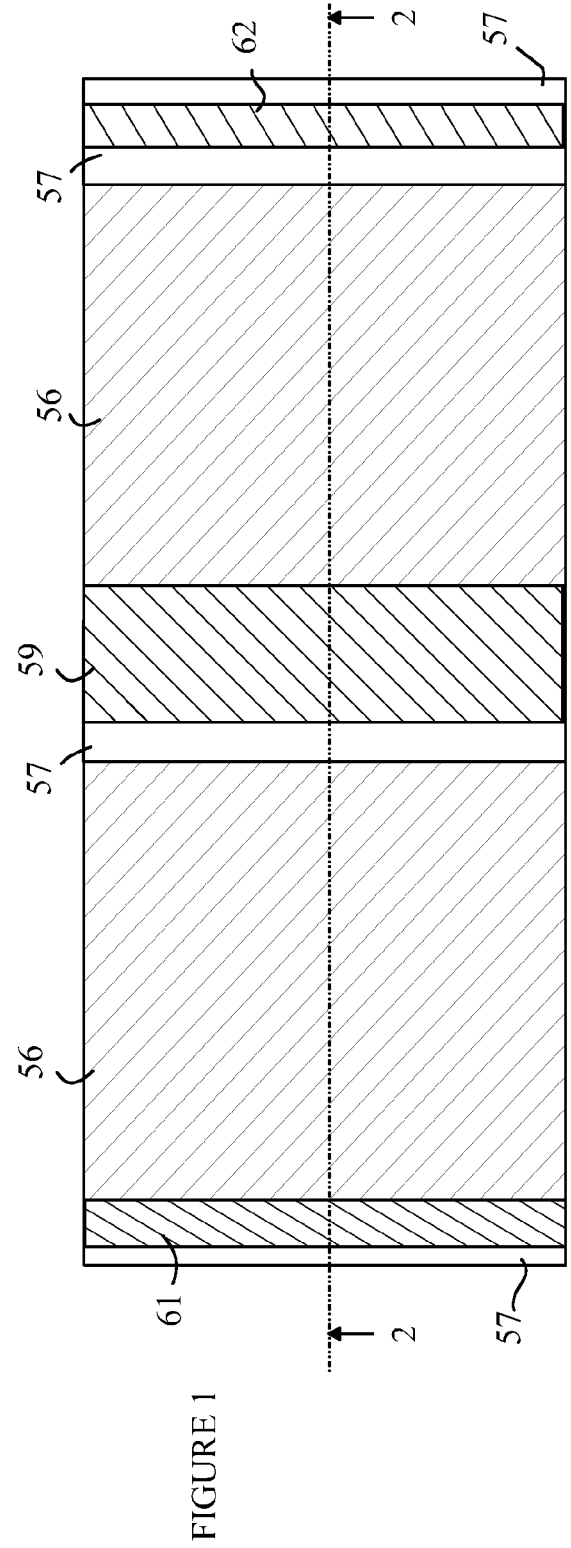
FIG. 1 is a top view of segmented LED 60.

The manner in which the present invention provides its advantages can be more easily understood with reference to FIGS. 1 and 2, which illustrate a die containing a segmented LED. FIG. 1 is a top view of segmented LED 60, and FIG. 2 is a cross-sectional view of segmented LED 60 through line 2-2 shown in FIG. 1. Segmented LED 60 includes two segments 64 and 65; however, it will be apparent from the following discussion that light sources having many more segments can be constructed from the teachings of the present invention. Segmented LED 60 is constructed from the same three-layer LED structure in which the layers are grown on a sapphire substrate 51. The n-layer 52 is grown on substrate 51, and then the active layer 55 and p-layer 53 are grown over n-layer 52.

The segments 64 and 65 are separated by an isolation trench 66 that extends through layer 52 to substrate 51 thereby electrically isolating segments 64 and 65. Isolation trench 66 includes a plateau 67 that extends only partially into layer 52. The walls of isolation trench 66 are covered by an insulating layer 57 that includes an open area 58 for making electrical contact to the portion of layer 52 associated with each segment. Insulating layer 57 can be constructed from any material that provides an insulating layer that is free of pinhole defects. For example, SiNx, SiOx, or other such dielectric films commonly used in semiconductor device fabrication can be used as the insulating material. Other materials can include polyimide, BCB, spin-on-glass and materials that are routinely used in the semiconductor industry for device planarization.

Similar trenches are provided on the ends of segmented LED 60 as shown at 68 and 69. A serial connection electrode 59 is deposited in isolation trench 66 such that electrode 59 makes contact with layer 52 through opening 58 in insulating layer 57. Electrode 59 also makes electrical contact with indium tin oxide (ITO) layer 56 in the adjacent segment. Hence, when power is provided via electrodes 61 and 62, segments 64 and 65 are connected in series. As a result, segmented LED 60 operates at twice the voltage and half the current as a conventional LED.

It should be noted that layers 52, 53, and 55 are not shown to scale in FIG. 2. In general, layer 52 is much thicker than layer 53, since the p-type material has a very high resistivity for the GaN family of materials, and hence, the thickness of this layer is kept as thin as possible to avoid resistive losses in the layer. It should also be noted that a significant fraction of the light generated in active layer 55 is trapped in layers 52 and 53 due to the large difference in index of fraction between the GaN material layers and the surrounding medium. Normally, this light exits the die through the side surfaces of the die and is directed upward by a suitable reflector. Since layer 52 is much thicker than layer 53, most of this horizontally traveling light is in layer 52. Accordingly, the deep trenches through layer 52 interrupt the transmission of this trapped light. If the material in the trench (i.e., the material that insulates the walls of the trench or the conductor) is opaque, this light will be lost. Even in cases in which the trench is filled with a transparent material, the difference in index of refraction between that material and the GaN material results in reflections that, in turn, lead to light losses. Finally, as noted above, cutting the deep trenches through all three layers results in increased fabrication cost.

Accordingly, it would be advantageous to provide a segmented LED design in which the deep trenches described above are not utilized to isolate the individual component LEDs. In principle, the depth of the trenches could be reduced by reducing the thickness of layer 52. However, there is a minimum thickness for this layer that is dictated by the need to compensate for the difference in lattice constants between the LED material and that of substrate 51. In addition, reducing the thickness does not solve the problem of light losses due to the interruption of layer 52 by the trenches.

Figure 3:
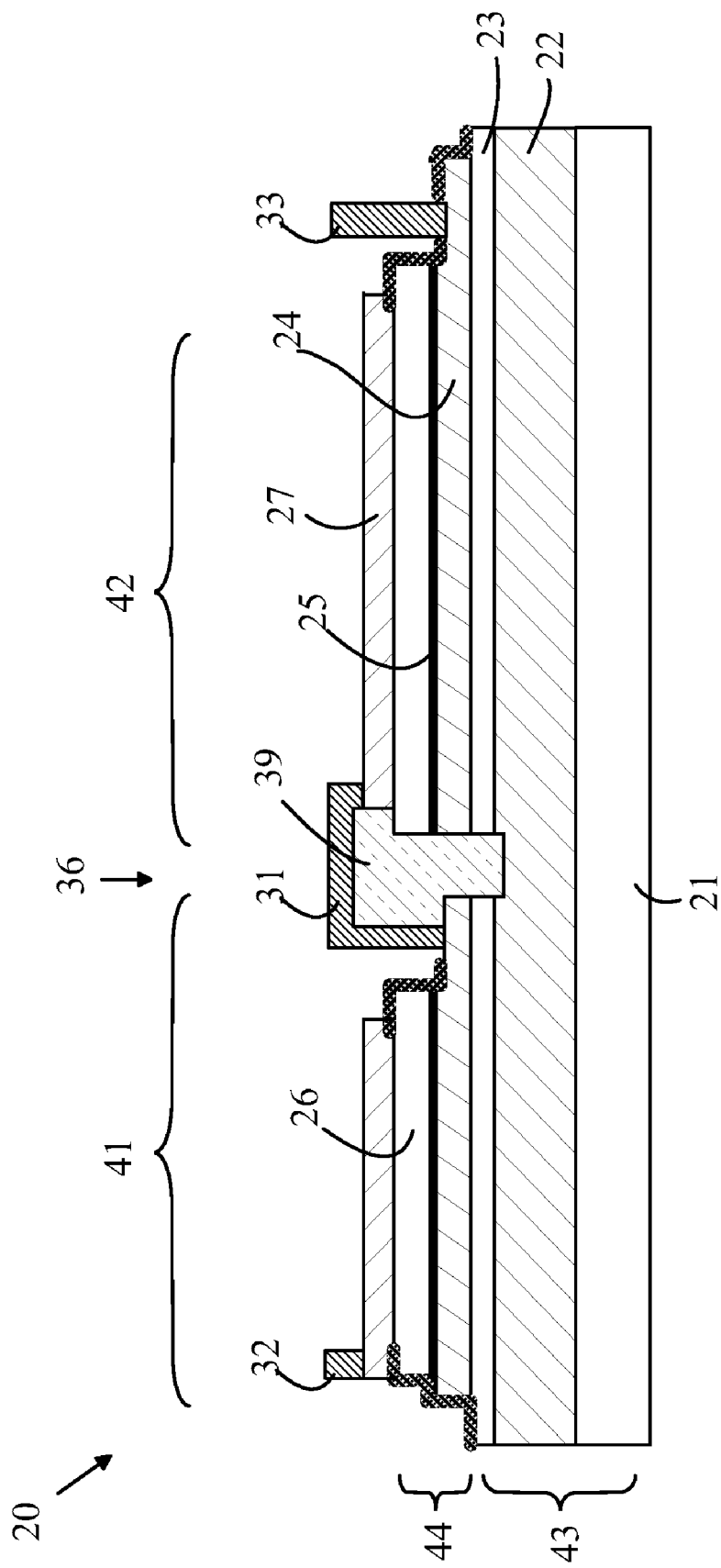
FIG. 3 is a cross-sectional view of a GaN segmented LED light source according to one embodiment of the present invention.

Refer now to FIG. 3, which is a cross-sectional view of a GaN segmented LED light source according to one embodiment of the present invention. Light source 20 includes only two component LEDs shown at 41 and 42; however, light sources with more component LEDs can be constructed in an analogous manner. Light source 20 can be viewed as a segmented LED 44 that is constructed on a compound substrate 43. Compound substrate 43 is constructed on a sapphire substrate 21 on which an n-GaN layer 22 is deposited followed by a p-GaN layer 23. Layer 22 is as thick as the conventional n-GaN layers used in conventional LEDs, and hence, provides the advantages associated therewith such as compensating for the lattice mismatch between the sapphire substrate and the various GaN layers. A reverse-biased diode is formed by layer 24, which is discussed below, and layer 23, and hence, current is blocked from flowing into layer 22 during the operation of the light source.

Segmented LED 44 is constructed from a thin n-GaN layer 24, an active layer 25, and a p-GaN layer 26. A current spreading layer 27 is deposited over layer 26. Layer 27 is typically ITO. Light source 20 is powered by applying a potential difference between electrodes 32 and 33.

The segments of segmented LED 44 are isolated from one another by a trench 36 that extends through layers 24-26 into layer 22. Since no current can flow through the junction of layer 24 and layer 23, the trench does not need to extend to the sapphire substrate 21. Accordingly, a much shallower trench can be utilized to isolate the segments. In addition, light traveling sideways through layer 22 is no longer interrupted by the trench and any material deposited in the trench, such as the insulator shown at 39 that provides a structure on which serial connecting electrode 31 is deposited. Hence, the problems associated with interrupting the flow of light in the horizontal direction are significantly reduced.

In principle, the trench only needs to extend to the top surface of layer 22. However, controlling the etch rate such that the trench stops on layer 22 presents problems. Accordingly, the trench is etched slightly into layer 22 as shown in FIG. 3 to assure that the horizontal transmission of the current is blocked.

Figure 4:
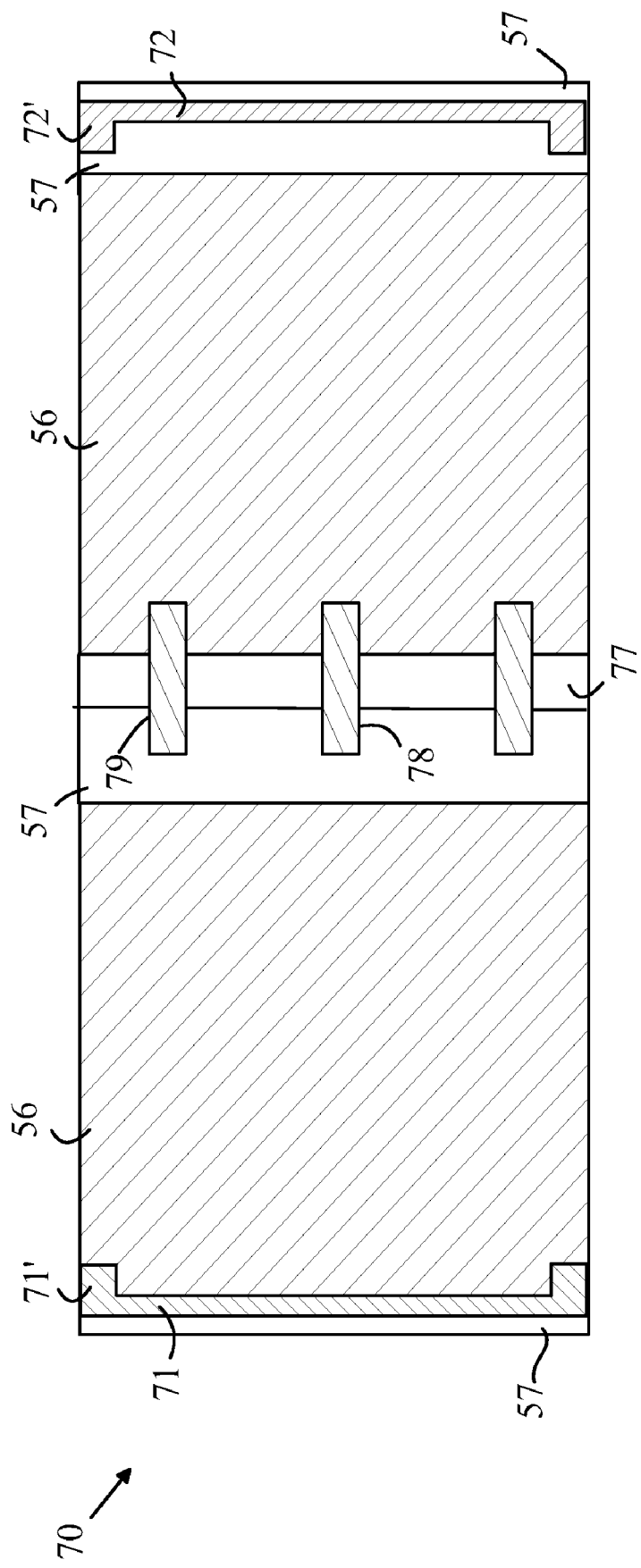
FIG. 4 is a top view of a segmented LED 70 according to another embodiment of the present invention.

In the embodiments shown in FIGS. 1 and 2, electrode 59 extends over the entire width of segmented LED 60. The portion of segment 65 that underlies electrode 59 is non-productive since light generated below electrode 59 is blocked and absorbed by electrode 59. This leads to reduced light conversion efficiency as well as reduced efficiency in utilization of the die surface, and hence, increased cost for the light source since an additional active die area must be provided to compensate for this lost area. Refer now to FIG. 4, which is a top view of a segmented LED 70 according to another embodiment of the present invention.

Segmented LED 70 differs from segmented LED 60 in that the wide interconnect electrode 59 has been replaced by a plurality of serial electrodes such as electrodes 78 and 79. These electrodes can be only 5-10 microns wide and spaced approximately 150 microns apart, and thus, cover a much smaller area on segment 65 than electrode 59. Accordingly, the loss in efficiency discussed above is substantially reduced. In addition, the n-electrode 72 and p-electrode 71 have been replaced by narrow electrodes that include wider pads 71' and 72' for wire bonding to external circuitry. In one preferred embodiment, the serial electrodes are spaced apart by a distance that is more than 5 times the width of the electrodes so that the area covered by the serial electrodes is significantly less than the width of the segments that are being connected in the segmented LED.

The number of serial connection electrodes that are needed depends on the conductivity of ITO layer 56. There must be sufficient serial connection electrodes to assure that current is spread evenly over ITO layer 56. The width of the serial connection electrodes is set by the amount of current that must be passed between segments, and hence, depends on the conductor used, the thickness of the conductor, and the number of serial connection electrodes. In the regions of segment 65 that are not covered by a serial connection layer, the isolation trench 77 does not require an insulating layer, and hence, the underlying LED structure receives power and generates useful light.

Figure 5C:
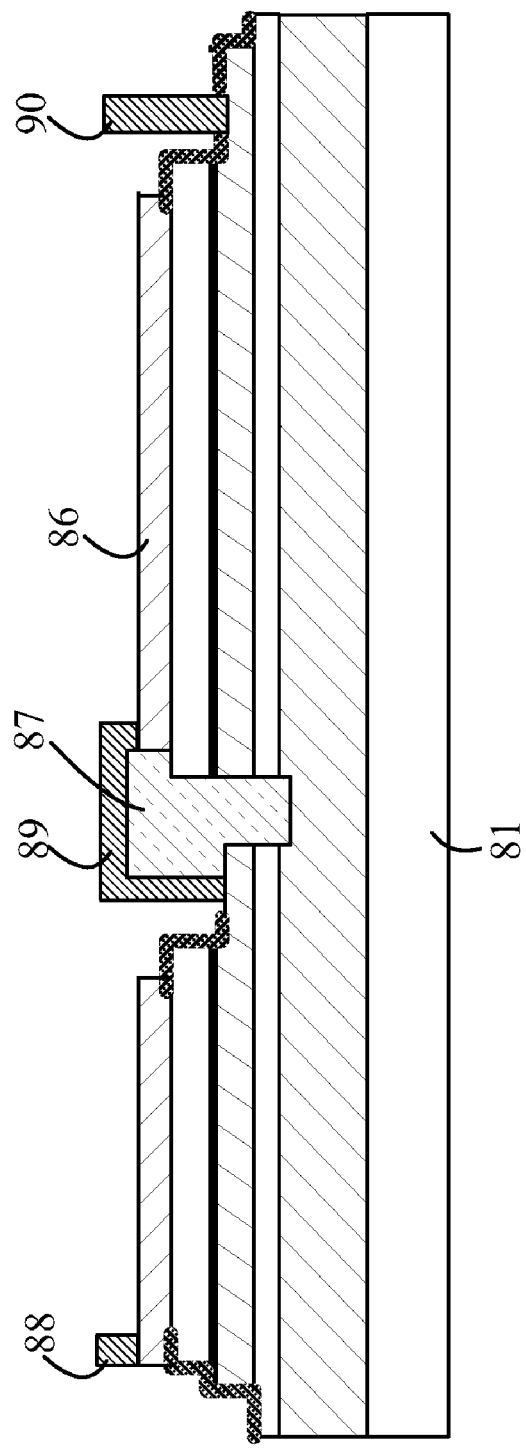

Refer now to FIGS. 5A-5C, which are cross-sectional views of a light source 80 at various stages in the fabrication process. The process starts by growing the various GaN layers on a sapphire substrate 81. These layers include the layers that form a compound substrate 82 and the layers 83 that form the LED segments. The compound substrate layers include an n-GaN layer 82a that mitigates the problems associated with the lattice mismatch between GaN and sapphire, and a p-GaN layer 82b that provides the current blocking layer that prevents current from flowing into layer 82a during the operation of the light source.

The LED segments are constructed from the three layers shown at 83a-83c, namely, an n-GaN layer 83a, an active layer 83b, and a p-GaN layer 83c. The combination of layer 83c and layer 82b form a reverse-biased diode that prevents current from flowing into layers 82b and 82a during the operation of the light source.

It should be noted that each of the layers discussed above may include a plurality of sub-layers. For example, the active layer 83b typically includes a plurality of quantum well layers separated by buffer layers. To simplify the discussion, the various sub-layers have been omitted, as those layers are conventional in the art.

Refer now to FIG. 5B, which illustrates light source 80 after the isolation trench(s) has been etched to isolate the various component LEDs that are to be serially connected to form the final light source. The isolation trench is shown at 84b and extends down to 82a. Additional trenches are cut as shown at 84a and 84c to provide the anode and cathode contacts. A patterned layer of an insulator such as SiNx is then deposited to protect the side surfaces of the LED related layers and to insulate the areas that do not generate light to prevent power from being wasted in these areas.

Refer now to 5C. After the insulating layer 85 is deposited, the insulating bridges 87 are deposited and a patterned layer of ITO is deposited as shown at 86. Finally, the anode, serial connecting electrodes, and cathode are deposited as a patterned metal layer as shown at 88, 89, and 90, respectively.

Figure 6:
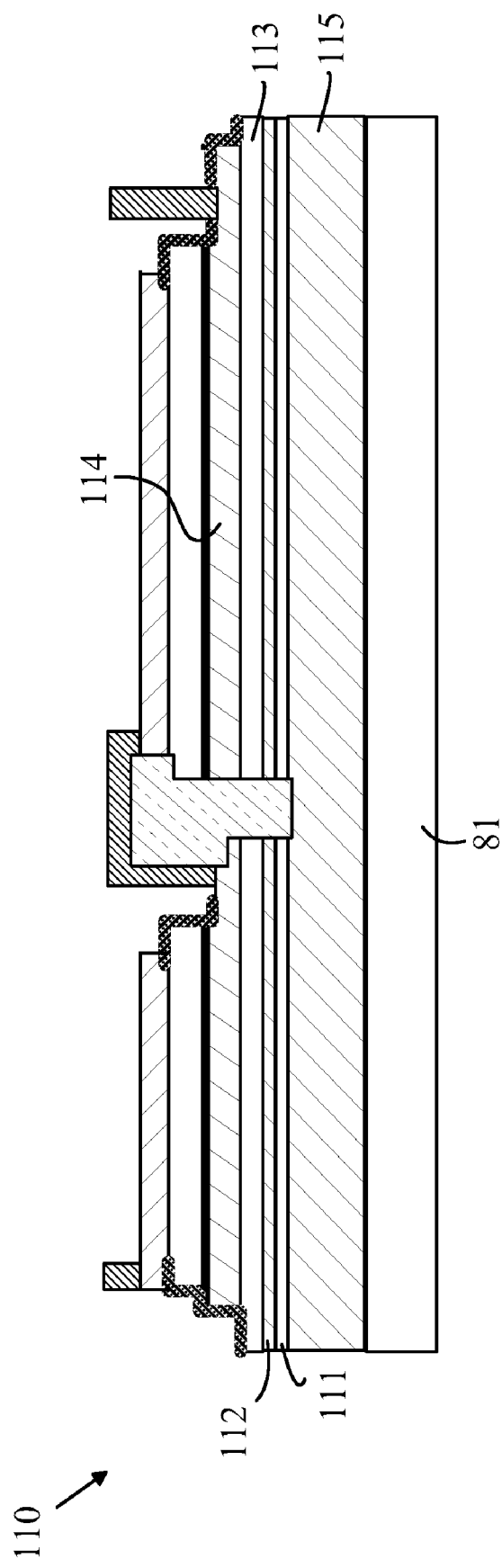
FIG. 6 is a cross-sectional view of another embodiment of a light source according to the present invention.

The above-described embodiments utilize a single reverse biased electrode to insulate the underlying n-GaN layer from the LED segments. However, embodiments in which a plurality of diodes are deposited before depositing the LED segment layers can also be constructed. Refer now to FIG. 6, which is a cross-sectional view of another embodiment of a light source according to the present invention. Light source 110 includes two component LEDs that are constructed in a manner analogous to that discussed above with respect to the embodiments shown in 5A-5C. Light source 110 differs from the above-described embodiments in that two reverse-biased diodes are utilized to insulate n-GaN layer 115 from the LEDs. The first diode is at the boundary of p-GaN layer 111 and n-GaN layer 112. The second reverse-biased diode is at the boundary between p-GaN layer 113 and n-GaN layer 114.

The additional reverse biased diode or diodes provide added isolation of the component LEDs from the underlying n-GaN substrate and provide increased protection against electrostatic discharge damage, since the discharge voltage needed to short the device is now increased by the sum of the breakdown voltages of the reverse biased diodes. It should be noted that some leakage current can flow between the isolated component LEDs so long as the magnitude of that current is small compared to the current flowing through the series connected LEDs. For the purposes of this discussion, the component LEDs will be defined to be electrically isolated by the reverse biased diodes if the leakage current is less than 2 percent of the current flowing through the series connected component LEDs via the connecting bridges.

The above-described embodiments utilize the GaN family of materials. For the purposes of this discussion, the GaN family of materials is defined to be all alloy compositions of GaN, InN and AlN. However, embodiments that utilize other material systems and substrates can also be constructed according to the teachings of the present invention.

The above-described embodiments utilize a reversed diode arrangement to block current from passing under the barriers that separate the component LEDs. However, any form of diode that blocks the current could be utilized.

The above-described embodiments of the present invention and the summary of the invention have been provided to illustrate various aspects of the invention. However, it is to be understood that different aspects of the present invention that are shown in different specific embodiments can be combined to provide other embodiments of the present invention. In addition, various modifications to the present invention will become apparent from the foregoing description and accompanying drawings. Accordingly, the present invention is to be limited solely by the scope of the following claims.

What is claimed is:

1. A light source comprising
   a substrate;
   a light emitting structure deposited on said substrate;
   a barrier that divides said light emitting structure into first and second segments;
   a serial connection electrode that connects said first segment in series with said second segment; and
   a first blocking diode between said light emitting structure and said substrate, said first blocking diode preventing current from flowing between said light emitting structure and said substrate when said light emitting structure is emitting light,
   wherein said barrier extends through said light emitting structure into said first blocking diode.

2. The light source of claim 1 wherein said substrate comprises a transition layer of semiconductor material that is transparent to light generated by said light emitting structure and wherein said barrier comprises a trench extending through said light emitting structure and terminating in said transition layer.

3. The light source of claim 1 further comprising a second blocking diode between said first blocking diode and said substrate, said second blocking diode preventing current from flowing between said light emitting structure and said substrate when said light emitting structure is emitting light.

4. The light source of claim 1 wherein said serial connection electrode comprises a plurality of isolated conductors that span said barrier.

5. The light source of claim 2 wherein said barrier does not substantially interrupt light traveling in said transition layer.

6. The light source of claim 2 wherein said serial connection electrode comprises a layer of electrically conducting material deposited in said trench, said trench having an insulating layer that prevents said layer of electrically conducting material from making direct contact with walls of said light emitting structure that are exposed in said trench.

7. The light source of claim 2 comprising an insulating layer underlying a portion of said serial connection electrode that overlies said light emitting structure.

8. The light source of claim 1 wherein said semiconductor materials comprise alloy compositions of GaN, InN, and AlN.

* * * * *